United States Patent
Pons et al.

(10) Patent No.: US 9,888,608 B2
(45) Date of Patent: Feb. 6, 2018

(54) ELECTRONICS STRUCTURE COMPRISING AT LEAST ONE BARRIER IMPERMEABLE TO FINE PARTICLES

(71) Applicant: Airbus Operations SAS, Toulouse (FR)

(72) Inventors: Philippe Pons, Muret (FR); Pierre Salles, La Salvetat Saint Gilles (FR)

(73) Assignee: Airbus Operations SAS (FR)

( * ) Notice: Subject to any disclaimer, the term of this patent is extended or adjusted under 35 U.S.C. 154(b) by 142 days.

(21) Appl. No.: 14/132,204

(22) Filed: Dec. 18, 2013

(65) Prior Publication Data

US 2014/0168871 A1   Jun. 19, 2014

(30) Foreign Application Priority Data

Dec. 19, 2012   (FR) .................................... 12 62351

(51) Int. Cl.
   *H05K 7/18*   (2006.01)
   *H05K 7/14*   (2006.01)

(52) U.S. Cl.
   CPC ............. *H05K 7/18* (2013.01); *H05K 7/1421* (2013.01)

(58) Field of Classification Search
   CPC .... H05K 7/18; H05K 7/20536–7/2083; H05K 7/20–7/2099
   USPC ......................................................... 266/48
   See application file for complete search history.

(56) References Cited

U.S. PATENT DOCUMENTS

| | | | | |
|---|---|---|---|---|
| 3,956,458 A | * | 5/1976 | Anderson | B01D 53/64 423/210 |
| 4,089,040 A | * | 5/1978 | Paulsen | H05K 7/20572 174/16.1 |
| 4,153,225 A | * | 5/1979 | Paulsen | H05K 7/20572 244/118.1 |
| 4,737,173 A | * | 4/1988 | Kudirka | B01D 46/0023 55/470 |
| 4,749,390 A | * | 6/1988 | Burnett | B01D 46/12 55/410 |
| 5,230,723 A | * | 7/1993 | Travis | A47L 5/38 55/323 |
| 5,512,086 A | * | 4/1996 | Glucksman | B01D 46/0005 55/471 |
| 5,626,820 A | * | 5/1997 | Kinkead | A61L 9/046 422/122 |
| 6,297,950 B1 | * | 10/2001 | Erwin | B01D 46/0005 361/679.49 |
| 6,361,590 B1 | * | 3/2002 | Gilbert, Jr. | B01D 46/0043 55/385.1 |
| 6,432,177 B1 | * | 8/2002 | Dallas | B01D 53/0415 429/410 |
| 6,464,760 B1 | * | 10/2002 | Sham | B01D 46/0015 55/318 |

(Continued)

*Primary Examiner* — Robert J Hoffberg
*Assistant Examiner* — Matt Dhillon
(74) *Attorney, Agent, or Firm* — Lerner, David, Littenberg, Krumholz & Mentlik, LLP (57) ABSTRACT

An electronics structure includes at least one barrier impermeable to fine particles, interposed between at least one Electrical and/or Electronics ("E & E") system and the frame of the structure. The barrier delimits, with the frame and the E & E system, a first area isolated from the outside of the electronics structure. The structure makes it possible to isolate sensitive electrical and electronic components from fine particles such as dust dispersed outside the electronics structure.

12 Claims, 9 Drawing Sheets

(56) References Cited

U.S. PATENT DOCUMENTS

| | | | | |
|---|---|---|---|---|
| 6,552,900 B1* | 4/2003 | Hoefer | H05K 7/20181 | 174/383 |
| 6,932,443 B1* | 8/2005 | Kaplan | H05K 7/20545 | 312/213 |
| 7,082,030 B2* | 7/2006 | Nakamura | H05K 7/20581 | 165/122 |
| 7,226,353 B2* | 6/2007 | Bettridge | H05K 7/20736 | 361/695 |
| 7,291,205 B2* | 11/2007 | Chu | F24F 3/1411 | 422/186.3 |
| 7,573,708 B2* | 8/2009 | Stewart | H05K 7/20563 | 361/679.54 |
| 7,656,660 B2* | 2/2010 | Hoeft | H05K 7/20745 | 181/200 |
| 8,047,904 B2* | 11/2011 | Yates | B65D 88/745 | 454/118 |
| 8,097,067 B2* | 1/2012 | Fox | B01D 46/0086 | 55/DIG. 34 |
| 8,456,840 B1* | 6/2013 | Clidaras | H05K 7/20745 | 165/104.22 |
| 8,675,357 B2* | 3/2014 | Namek | H05K 7/20745 | 181/202 |
| 8,797,742 B2* | 8/2014 | Kawai | H05K 7/20854 | 361/704 |
| 8,964,375 B2* | 2/2015 | Claassen | H05K 7/20736 | 312/223.1 |
| 9,198,310 B2* | 11/2015 | Eichelberg | H05K 7/20745 | |
| 9,648,784 B2* | 5/2017 | Keisling | H05K 7/20609 | |
| 2002/0106919 A1* | 8/2002 | Behl | G11B 33/02 | 439/136 |
| 2002/0135990 A1 | 9/2002 | Hattori | | |
| 2004/0020363 A1* | 2/2004 | LaFerriere | B01D 46/0028 | 95/273 |
| 2004/0250992 A1* | 12/2004 | Aoki | H05K 7/20727 | 165/80.3 |
| 2005/0128689 A1* | 6/2005 | Caci | H01M 8/0432 | 361/679.02 |
| 2007/0123160 A1* | 5/2007 | Mandel | H05K 7/207 | 454/184 |
| 2007/0236881 A1* | 10/2007 | Harder | H05K 7/202 | 361/695 |
| 2007/0285886 A1* | 12/2007 | Huang | G06F 1/1601 | 361/679.49 |
| 2009/0002938 A1* | 1/2009 | Stewart | H05K 7/20563 | 361/679.48 |
| 2009/0170418 A1* | 7/2009 | Codling | F24F 3/1607 | 454/66 |
| 2009/0190301 A1* | 7/2009 | Huang | H05K 7/20736 | 361/679.46 |
| 2009/0251860 A1* | 10/2009 | Belady | H05K 7/20745 | 361/690 |
| 2010/0313757 A1* | 12/2010 | Crabtree | B01D 39/1623 | 95/273 |
| 2011/0007474 A1* | 1/2011 | Detore | G01N 33/92 | 361/679.48 |
| 2012/0062084 A1* | 3/2012 | Lewis, II | H05K 5/0234 | 312/223.6 |
| 2013/0047859 A1* | 2/2013 | Bohlen | B03C 3/47 | 96/80 |
| 2013/0250521 A1* | 9/2013 | Kawai | H05K 7/20854 | 361/714 |
| 2014/0069127 A1* | 3/2014 | Bailey | H05K 7/20836 | 62/96 |
| 2014/0168871 A1* | 6/2014 | Pons | H05K 7/18 | 361/679.01 |
| 2014/0345238 A1* | 11/2014 | Jun | H05K 7/20718 | 55/385.4 |
| 2016/0262277 A1* | 9/2016 | Lewis, II | H05K 5/0234 | |

* cited by examiner

ELECTRONICS STRUCTURE COMPRISING AT LEAST ONE BARRIER IMPERMEABLE TO FINE PARTICLES

TECHNICAL FIELD

The present invention relates to an electronics structure comprising at least one barrier impermeable to fine particles, said electronics structure being more particularly suitable for an aircraft.

BACKGROUND OF THE INVENTION

An aircraft comprises an electrical and electronic bay (known as an E & E bay) in which are installed various items of equipment, required, notably, for the piloting of the aircraft and for the control of the electrical energy and of other networks such as the communications and fluid networks. Thus this bay generally comprises a plurality of electronics cabinets in which are arranged various electrical and electronic elements, grouped in electrical and electronic systems. In the remainder of the description, the abbreviation E & E signifies "electrical and/or electronic".

Figure 1:
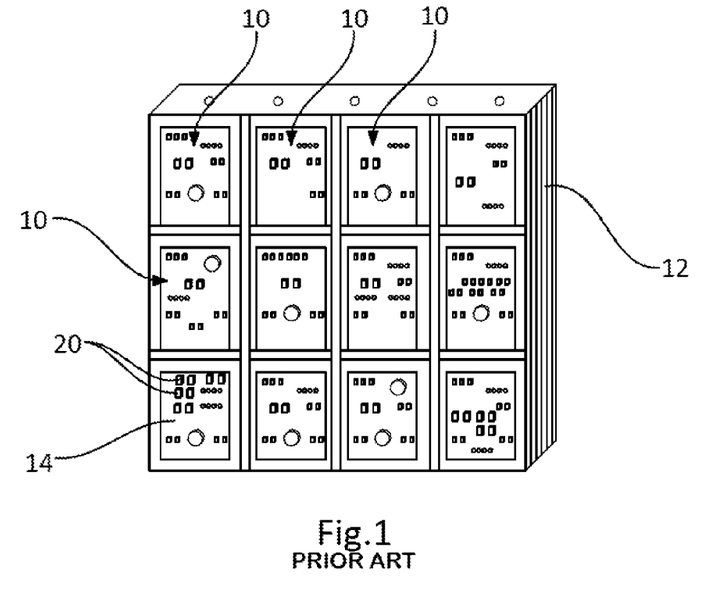
FIG. 1 is a perspective view of an electronics cabinet according to the prior art.

As shown in FIG. 1, an electronics cabinet comprises a frame 12 and at least one E & E system 10 integrated into said frame 12.

In one embodiment, the frame 12 of a cabinet has a substantially parallelepipedal shape with solid lower and upper faces and perforated right and left faces, made of mesh material.

In one embodiment, an E & E system 10 has a substantially parallelepipedal shape with a front face 14, a rear face 16 and four side faces (lower, upper, right and left).

An E & E system 10 also comprises connection means 18 for its electrical and electronic connection, and, if necessary, controls and/or indicators 20 arranged on the front face 14.

In one embodiment, a frame 12 comprises at least one shelf 22 on which at least one E & E system 10 rests, and a back 24.

Preferably, the E & E system 10 is of the type known as rackable, a sliding joint 26 being interposed between said E & E system 10 and the frame 12. Thus the E & E system 10 is placed in position by a translational movement of said E & E system 10 with respect to the frame 12 in a direction defined by the sliding joint 26.

Figure 2:
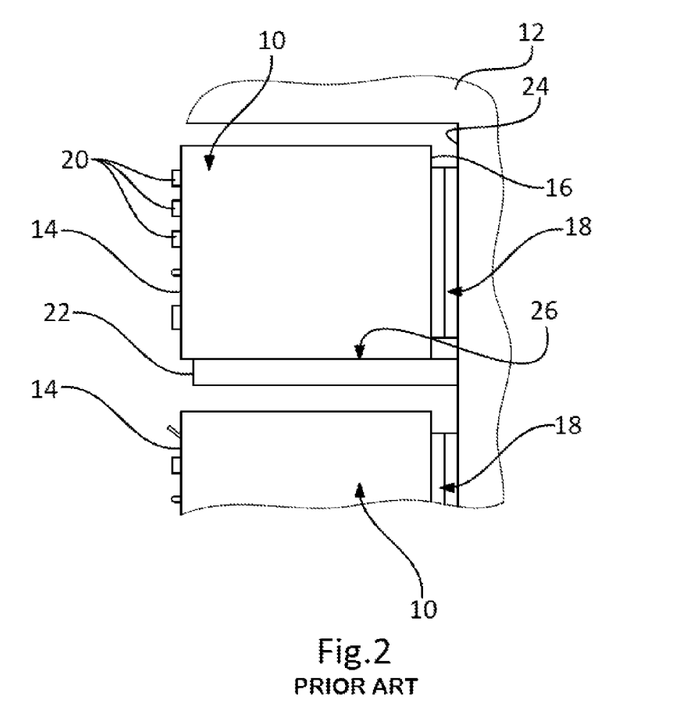
FIG. 2 is a vertical section through part of an electronics cabinet according to prior art.

Advantageously, the connection means 18 are interposed between the rear face 16 of the E & E system 10 and the back 24 of the frame 12, as shown in FIG. 2.

According to a first constraint, the E & E systems 10 generate a certain amount of heat which must be removed to allow them to operate in an optimal manner. Generally, use is made of a flow of cooling air which passes across the E & E systems to remove the amount of heat produced by them. Additionally, in order to promote the circulation of the air flow provided for cooling, the right, upper and left side walls of the E & E system 10 are spaced apart from the walls of the frame 12, and the right and left faces of the frame 12 are perforated.

According to a second constraint, an E & E bay of an aircraft is not a compartment of the clean room type in which the particle concentration is controlled. The atmosphere of the E & E bay therefore includes numerous fine particles which may be put into suspension (notably as a result of the air flows generated to cool the E & E systems 10) and may be deposited on some areas of the E & E systems.

The use of carbon for the aircraft structure gives rise to the formation of fine carbon particles, which are electrically conductive and which may harm the operation of the E & E systems, especially since these E & E systems are increasingly complex and sensitive to fine particles of carbon or other materials.

To limit the risks of malfunction, a first solution is to use dust-tight connection means 18 and E & E systems adapted to operate in dusty environments, for example varnished electronic circuit cards.

This solution tends to increase the cost of the aircraft, because of the high cost of dust-tight connection means 18 and E & E systems adapted to operate in dusty environments.

Another solution is to integrate the E & E systems 10 into an electronics cabinet fitted with a door, as shown for example in DE-101.19.095.

This solution is unsatisfactory for the following reasons:

A first drawback is that the presence of a door tends to increase the weight on board the aircraft.

Another drawback is that a free area must be provided in front of the electronics cabinet so that the door can be opened by pivoting. However, aircraft designers tend to reduce the spacing between the cabinets in order to reduce the volume of the E & E compartment.

Another drawback is that the door limits access to the front faces 14 of the E & E systems. In order to access the controls on the front face, therefore, the door must be opened, inevitably resulting in the ingress of fine particles.

This problem may also arise in a computer in which an electronic circuit card is removably fitted, or more generally in any electronics structure such as an electronics cabinet, a computer or any other sub-assembly comprising at least a frame in which at least one E & E system such as a computer or an electronic circuit card is fitted.

BRIEF SUMMARY OF THE INVENTION

Various aspects of the present invention may overcome the drawbacks of the prior art.

An aspect of the invention proposes an electronics structure which comprises at least a frame into which at least one E & E system is fitted, and which is characterized in that it comprises at least one barrier impermeable to fine particles, interposed between at least one E & E system and the frame, said barrier delimiting, with the frame and said E & E system, a first area isolated from the outside of the electronics structure.

This solution makes it possible to isolate the electrical and electronic elements of the E & E system from fine particles such as carbon dust dispersed outside the electronics structure. Consequently it is possible to use conventional electrical connection means.

Preferably, the electronics structure comprises at least two barriers impermeable to fine particles, interposed between said E & E system and the frame. This arrangement enables the impermeability to be increased, among other benefits. Advantageously, in this case, said barriers are spaced so as to delimit, with the frame and the E & E system, a second area isolated from the first area and from the outside of the electronics structure, said second area comprising an inlet for cooling air for the E & E system and a cooling air outlet. Thus, by connecting the various second areas of an electronics structure, it is possible to create a conduit for the cooling air for the E & E systems of the electronics structure.

In some variants, at least one barrier is fixed to the E & E system.

In some variants, at least one barrier is fixed to the frame.

According to another characteristic of the invention, an electronics structure comprises at least one compartment in which at least one E & E system is fitted, and at least one barrier comprising a wall which extends over the whole cross section of the compartment and through which an E & E system may pass. This configuration enables an impermeable area to be provided even when the E & E system is not fitted into the frame.

According to another characteristic, the frame comprises a barrier extending on a front face of the frame. In a variant, a barrier comprises a flap which extends over the whole front face and which comprises at least one slit to allow an E & E system to be inserted into the frame. In another variant, a barrier comprises a plurality of brushes whose thread-like members are arranged in planes substantially coinciding with the front face of the frame.

In the last-mentioned variants, for at least one E & E system and preferably for all of them, each barrier fixed to the frame is offset towards the rear face relative to the front face of the E & E system when the latter is fitted into the frame, in such a way that said front face is always accessible.

BRIEF DESCRIPTION OF THE DRAWINGS

Other characteristics and advantages will be made clear by the following description of the invention, this description being provided solely by way of example, with reference to the attached drawings, in which.

DETAILED DESCRIPTION

The invention will now be described in relation to its application to a frame 32 of an electronics cabinet into which an E & E system 30 such as a computer is integrated in a removable manner.

Figure 3:
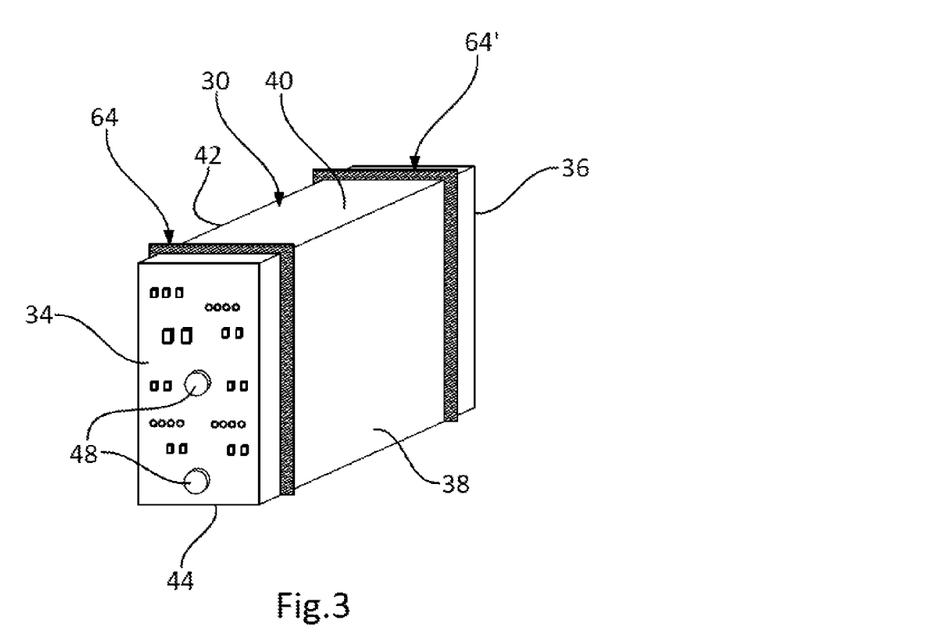
FIG. 3 is a perspective view of an E & E system illustrating an embodiment of the invention.

Referring to FIG. 3, in one embodiment, an E & E system 30 has a substantially parallelepipedal shape and comprises a front face 34, a rear face 36, a right face 38, an upper face 40, a left face 42, and a lower face 44. Preferably, the right face 38, upper face 40, left face 42 and lower face 44 are solid.

An E & E system 30 may have controls 48, indicators or other elements on its front face 34.

Figure 12A:
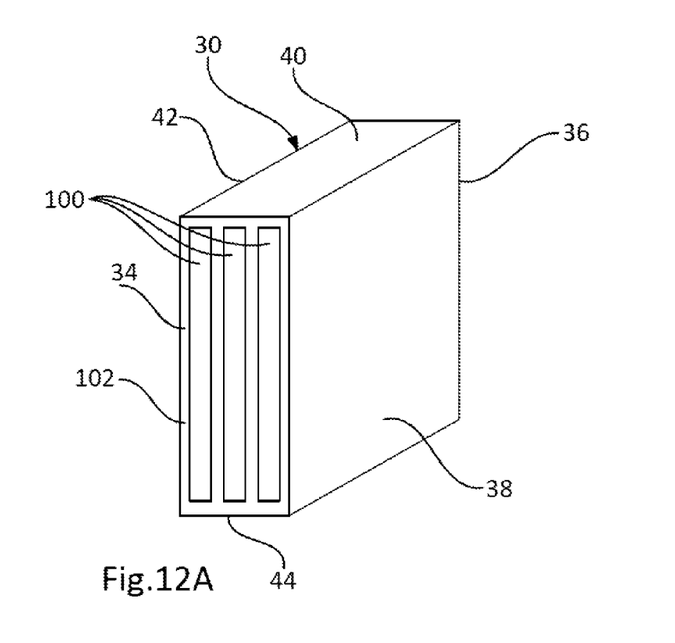
FIG. 12A is a perspective view of a computer into which cards are fitted.

In one embodiment illustrated in FIG. 12A, an E & E system 30 such as a computer may comprise a frame 102 into which at least one E & E system (of smaller size) such as an electronic circuit card 100 can be fitted through the front face 34 of the frame.

A frame 32 of a cabinet comprises at least one compartment 50 (FIGS. 6A and 6B) into which at least one E & E system 30 can be fitted.

Figure 5A:
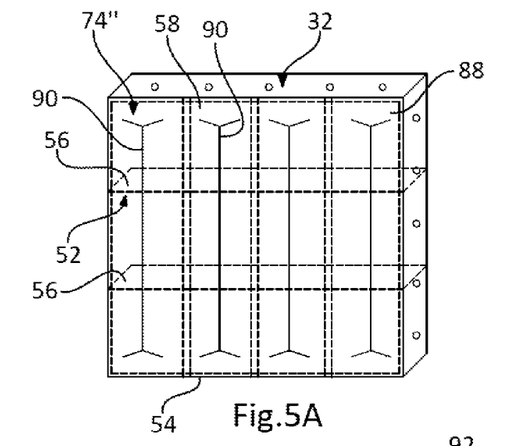
FIG. 5A is a perspective view of a frame of an electronics cabinet fitted with a barrier impermeable to fine particles according to a first variant.
Figure 5B:
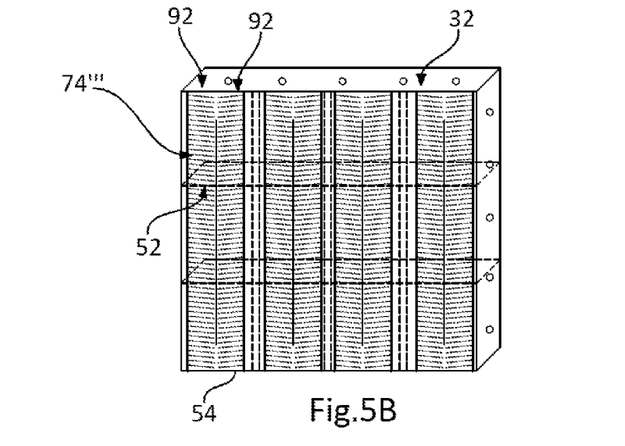
FIG. 5B is a perspective view of a frame of an electronics cabinet fitted with a barrier impermeable to fine particles according to another variant.

In one embodiment illustrated in FIGS. 5A and 5B, the frame 32 comprises a front face 52, a back 54, and left, upper, right and lower side walls. It preferably comprises shelves 56 for separating two compartments 50 placed one above the other and partitions 58 for separating two adjacent compartments in the same horizontal plane.

The front face 52 comprises at least one opening 60 to allow at least one E & E system 30 to be inserted. In one embodiment, the frame 32 comprises an opening 60 for each compartment 50.

In one embodiment, each E & E system 30 comprises connection means of the removable type for connection to the frame 32. Preferably, an E & E system 30 is of the rackable type and comprises a sliding joint to connect it to the frame 32, enabling the E & E system 30 to be guided in a direction Di (perpendicular to the front face 34) when it is inserted into the electronics cabinet.

In other embodiments, the E & E system 30 may rest on a shelf and may be immobilized there.

The E & E system 30 comprises electrical connection means 62. Advantageously, these electrical connection means 62 are interposed between the rear face 36 of the E & E system 30 and the back 54 of the frame 32. Thus the electrical connection means 62 comprise a first part fixed to the rear face 36 of the E & E system 30, which interacts with a second part fixed to the back 54 of the frame 32.

In the case of an E & E system of the rackable type, the system is immobilized with respect to translation when the electrical connection means 62 are correctly connected.

The electrical connection means 62 and the connection means of the removable type between the E & E system or systems 30 and the frame 32 are not described further, since they are known to those skilled in the art and may have different configurations.

Thus, regardless of the embodiment, the E & E system 30 can be in a first dismounted state outside the frame 32 and a second mounted state in which it is immobilized with respect to the frame 32. In the mounted state, the E & E system 30 is spaced apart from the frame 32 in respect of at least a part of its peripheral surface.

In the remainder of the description, the right face 38, the upper face 40, the left face 42 and the lower face 44 form the peripheral surface. Preferably, this peripheral surface is parallel to the direction Di.

In the illustrated embodiments, the peripheral surface is spaced apart from the frame 32 on three faces, namely the right face 38, the upper face 40, and the left face 42.

Regardless of the embodiment, there is a space E between the E & E system 30 and the frame 32, extending over the whole length of the E & E system 30 on at least a part of the peripheral surface of the E & E system 30.

For the purposes of the description, a length is considered to be a dimension in the direction Di. A transverse plane is considered to be a plane perpendicular to the direction Di.

In a first embodiment of the invention illustrated in FIG. 3, an E & E system 30 comprises at least one barrier 64, impermeable to fine particles, extending along at least a part of the peripheral surface of the E & E system 30 so as to fill the space E.

Fine particles are considered to be elements that can be put into suspension in air, for example carbon dust.

In one embodiment, the barrier 64 is placed in a transverse plane (perpendicular to the peripheral surface). Thus, as shown in FIG. 3, the barrier 64 extends on the right face 38, the upper face 40 and the left face 42.

The E & E system 30 preferably comprises a plurality of barriers 64, 64' spaced apart.

Advantageously, the barriers 64, 64' are parallel and spaced as far apart as possible. Thus the first barrier 64 is placed in the proximity of the front face 34, and the second barrier 64' is placed in the proximity of the rear face 36.

A barrier 64, 64' comprises a base 66 fixed to the E & E system 30 and a deformable wall 68 joined to the base 66, with an edge 70.

Figure 4A:
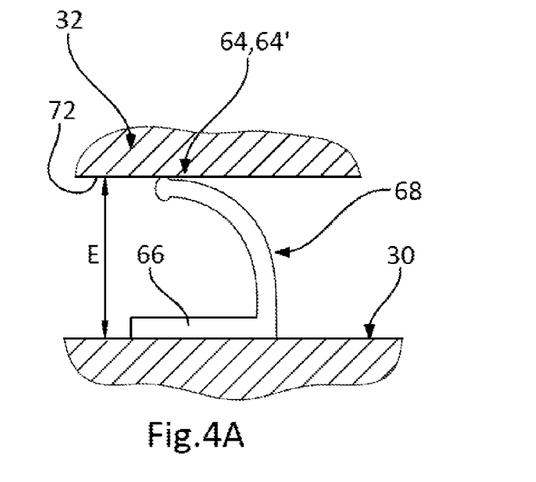
FIGS. 4A and 4B are cross sections illustrating barriers in different embodiments of the invention.

In one embodiment, shown in FIG. 4A, a barrier 64, 64' takes the form of a lip seal. In this case, the wall 68 is continuous.

Figure 4B:
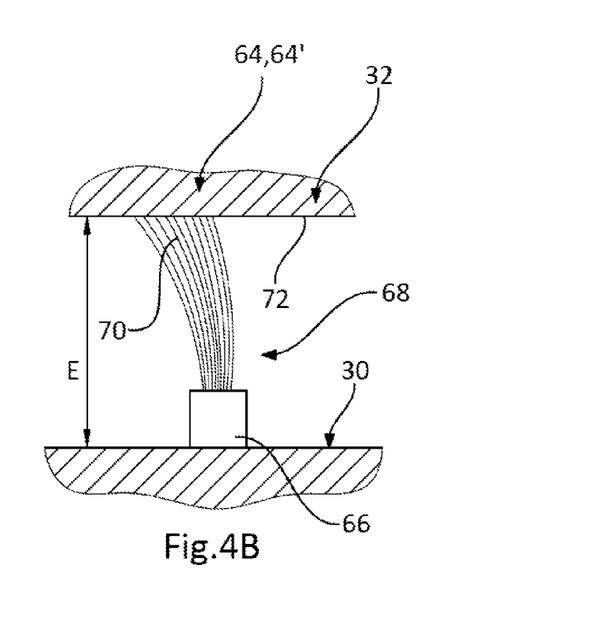

In another embodiment, shown in FIG. 4B, a barrier 64, 64' takes the form of a brush, preferably an electrostatic brush. In this case, the wall 68 is not continuous, but comprises a plurality of threadlike elements which are joined to the base 66 and are sufficiently dense to form a barrier.

A barrier 64 may be made in one piece over its whole length or may comprise a plurality of segments placed end to end, for example a segment for each face 38, 40, 42.

For its part, the frame 32 comprises at least one solid continuous bearing surface 72 (visible in FIGS. 7, 9, 10 and 11A) against which the free edge 70 of the barrier 64, 64' can bear, at least when the E & E system 30 is in the mounted state, to create a seal.

In one embodiment, each compartment 50 comprises a bearing surface 72 formed, according to the position of the compartment in the frame 32, by the left, upper, right and lower walls of the cabinet and/or by the shelves 56 and/or the partitions 58.

The height of the barrier 64, 64' is such that the free edge 70 exerts a pressure against the bearing surface 72.

In another embodiment of the invention illustrated in FIGS. 5A, 5B, 6A and 6B, the frame 32 comprises at least one barrier 74, impermeable to fine particles, which fills the space E.

In one embodiment, illustrated in FIG. 6, each compartment 50 comprises at least one barrier 74 which extends along at least a part of the peripheral surface of the compartment 50.

Figure 6A:
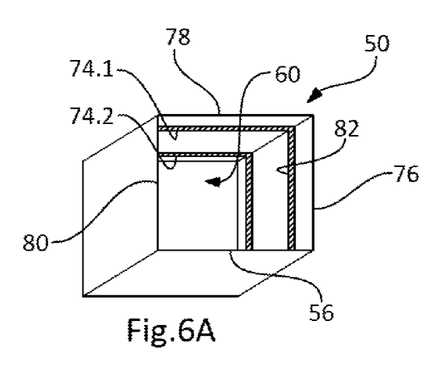
FIG. 6A is a perspective view of a compartment of a frame of an electronics cabinet fitted with a barrier impermeable to fine particles according to another variant.

In one embodiment, the barrier 74 is placed in a transverse plane, perpendicular to the peripheral surface of the compartment 50. As shown in FIG. 6A, the barrier 74 extends on the right face 76, the upper face 78 and the left face 80 of the compartment. A compartment 50 preferably comprises a plurality of barriers 74, 74.1 spaced apart.

Advantageously, the barriers 74, 74.1 are parallel and spaced as far apart as possible in the direction Di. Thus a first barrier 74 is placed in the proximity of the front face 52, and a second barrier 74.1 is placed in the proximity of the back 54.

In one embodiment, shown in FIG. 6A, a barrier 74 or 74.1 is identical to a barrier 64, 64', and comprises a base joined to the compartment and a deformable wall joined to the base with a free edge 82. As before, the height of the barrier 74, 74.1 is greater than the space E, so that the free edge 82 of the barrier 74 or 74.1 is in contact with the peripheral surface of the E & E system 30, at least when the latter is in the mounted state. In this embodiment, shown in FIG. 6A, the height of the barrier 74 is such that the barrier does not block the whole cross section of the compartment 50 when the E & E system 30 is taken out of the frame 32.

Figure 6B:
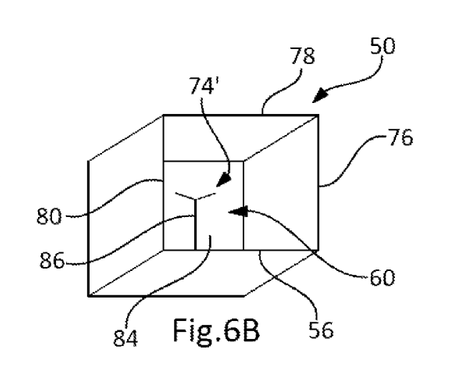
FIG. 6B is a perspective view of a compartment of a frame of an electronics cabinet fitted with a barrier impermeable to fine particles according to another variant.

In another embodiment shown in FIG. 6B, a barrier 74' comprises a wall which extends over the whole cross section of a compartment 50 and through which an E & E system 30 can pass.

In a first embodiment, the barrier 74' comprises a flap 84 which extends over the whole cross section of the compartment 50, preferably in a transverse plane, and which comprises a slit 86 allowing the insertion of an E & E system 30. By way of example, the slit 86 forms an I-shaped cut-out.

In another embodiment, a barrier could comprise two brushes, preferably electrostatic brushes, positioned facing each other. In this case, the free ends of the threadlike elements forming a first brush would overlap the free ends of the threadlike elements forming the second brush.

In other embodiments shown in FIGS. 5A and 5B, the frame 32 comprises a barrier 74" or 74''' extending on the front face 52 of the frame 32.

In a embodiment shown in FIG. 5A, a barrier 74" comprises a flap 88 which extends over the whole front face 52 and which comprises at least one slit 90 to allow an E & E system 30 to be inserted into the frame 32. In a specific embodiment, the E & E systems 30 are arranged in the frame 32 in a plurality of columns and the flap 88 comprises a number of slits 90 equal to the number of columns. Preferably, each slit 90 takes the form of an I-shaped cut-out.

In another embodiment shown in FIG. 5B, a barrier 74''' comprises a plurality of brushes 92 whose thread-like members are arranged in planes substantially coinciding with the front face 52 of the frame 32. In a specific embodiment, the E & E systems 30 are arranged in the frame 32 in a plurality of columns or rows. In this case, the barrier 74''' comprises, for each row or each column, a pair of brushes 92 positioned facing each other.

In the two embodiments shown in FIGS. 5A and 5B, the barriers 74" and 74''' can be in contact with the peripheral surface of the E & E system 30 when the latter is in the mounted state, in such a way that the front face of said E & E system 30 is accessible without the need to pass through said barriers 74" and 74'''.

The embodiments shown in FIGS. 5A, 5B and 6A have the advantage of providing impermeability to fine particles even in the absence of an E & E system 30.

Figure 11A:
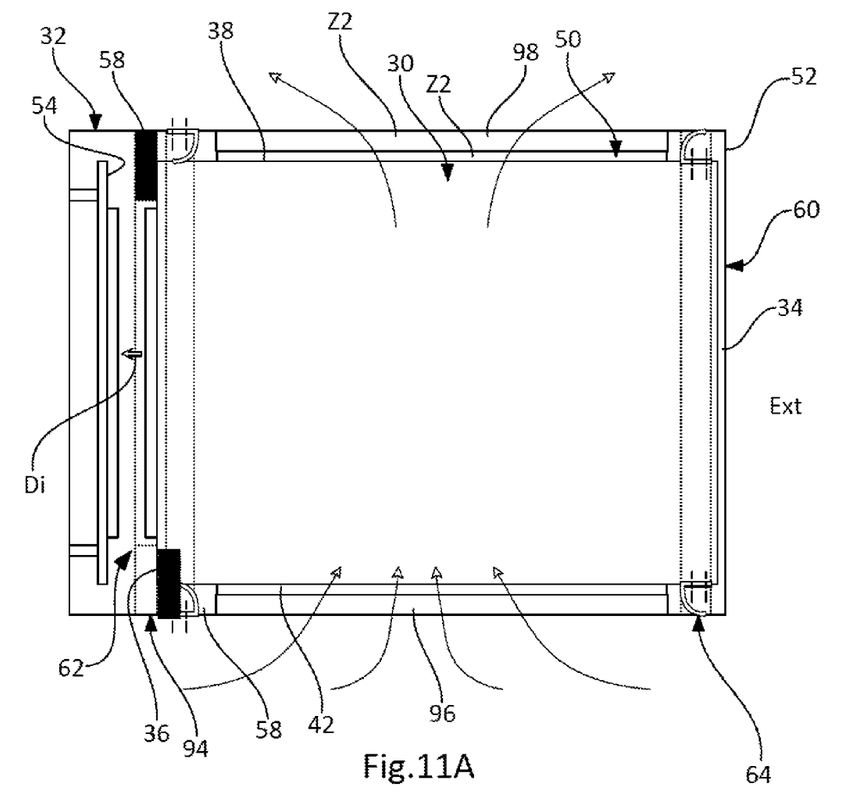
FIG. 11A is a horizontal section through an E & E system integrated into an electronics cabinet, illustrating an embodiment of the invention.
Figure 11B:
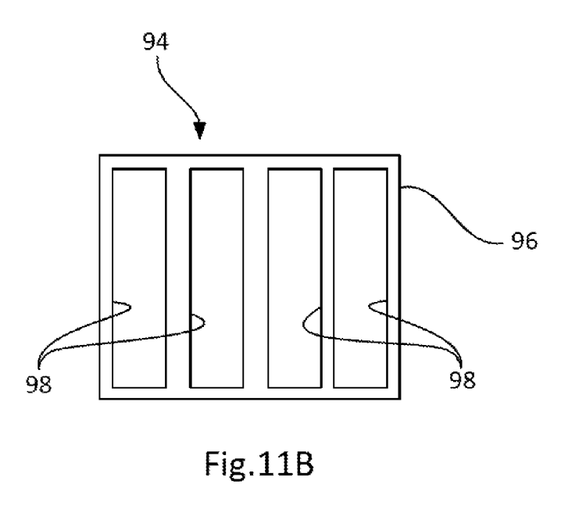
FIG. 11B is a front view of a joint provided on the E & E cabinet of FIG. 11A.

In other embodiments, a barrier 94 is neither fixed to an E & E system 30 nor fixed to the frame 32. As shown in FIG. 11A, a barrier 94 is interposed between an E & E system 30 and a frame 32.

In one embodiment, a barrier 94 takes the form of a flat seal 96 surrounding the electrical connection means 62.

Advantageously, a barrier 94 takes the form of a compressible plate with openings 98 for the electrical connection means of different E & E systems 30.

According to an embodiments of the invention, the electronics cabinet comprises at least one barrier impermeable to fine particles, interposed between an E & E system and the frame of the electronics cabinet, said barrier delimiting, with the frame and said E & E system, an area isolated from the outside of the cabinet, which preferably contains at least the electrical connection means of the E & E system. Thus it is possible to use conventional electrical connection means 62 which are not dust-tight. In the variants, said barrier is independent of the frame and of the E & E system, or fixed to the E & E system, or fixed to the frame.

Figure 7:
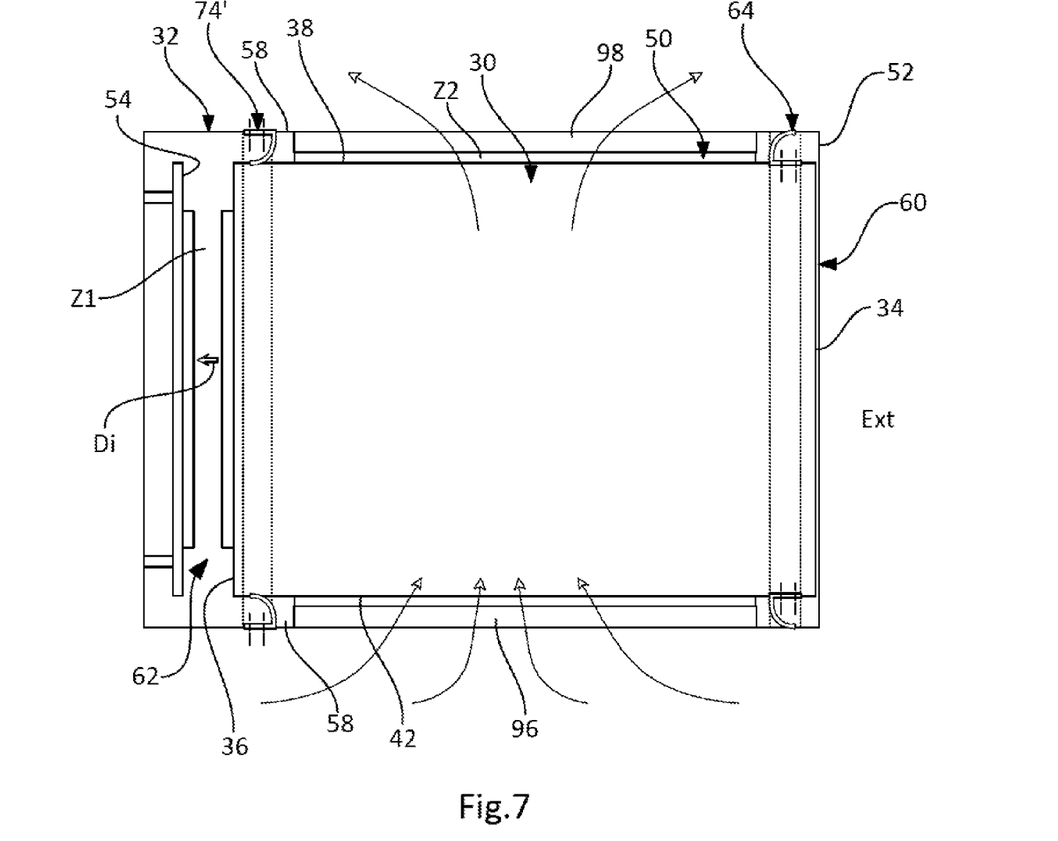
FIGS. 7 to 10 are horizontal sections through an E & E system integrated into an electronics cabinet, illustrating other embodiments of the invention.
Figure 10:
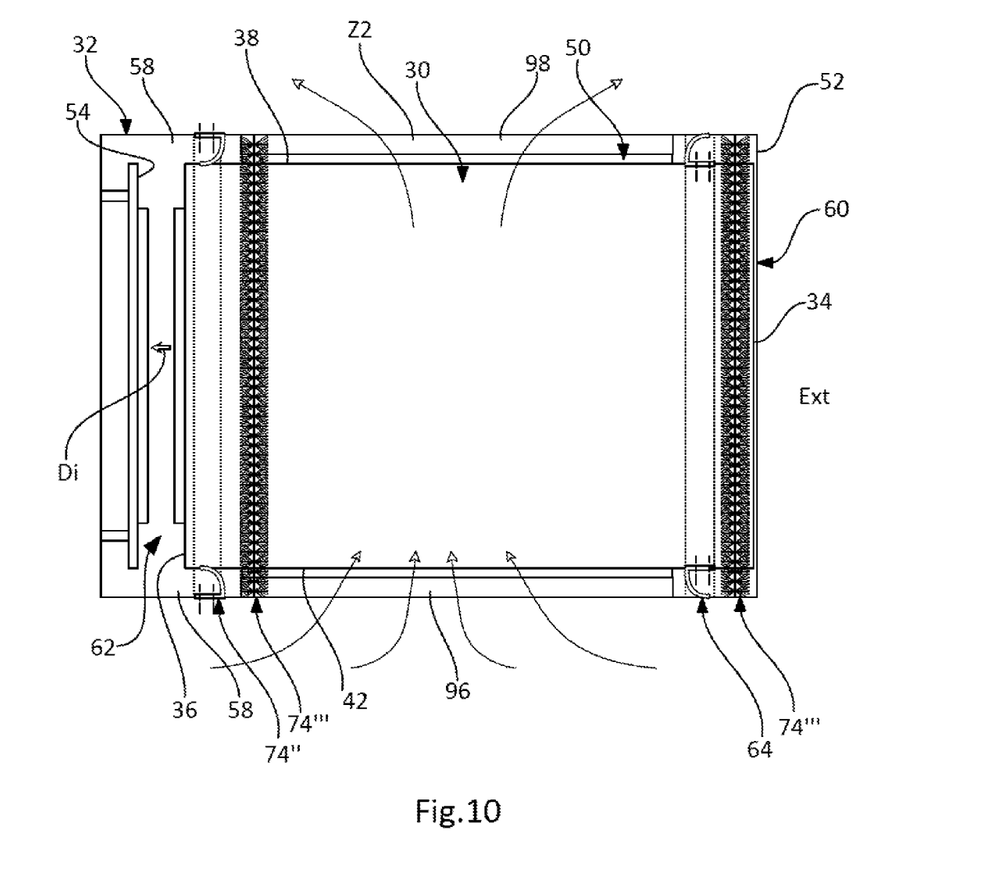

FIGS. 7, 10 and 11A represent different embodiments using the variants of the barriers impermeable to fine particles described above.

In FIG. 7, the E & E system 30 comprises a barrier 64 in the proximity of its front face 34, and the frame 32 comprises a barrier 74' (as shown in FIG. 6B) in the proximity of the back, capable of interacting with the peripheral surface of the E & E system 30 when the latter is in the mounted state.

Figure 8:
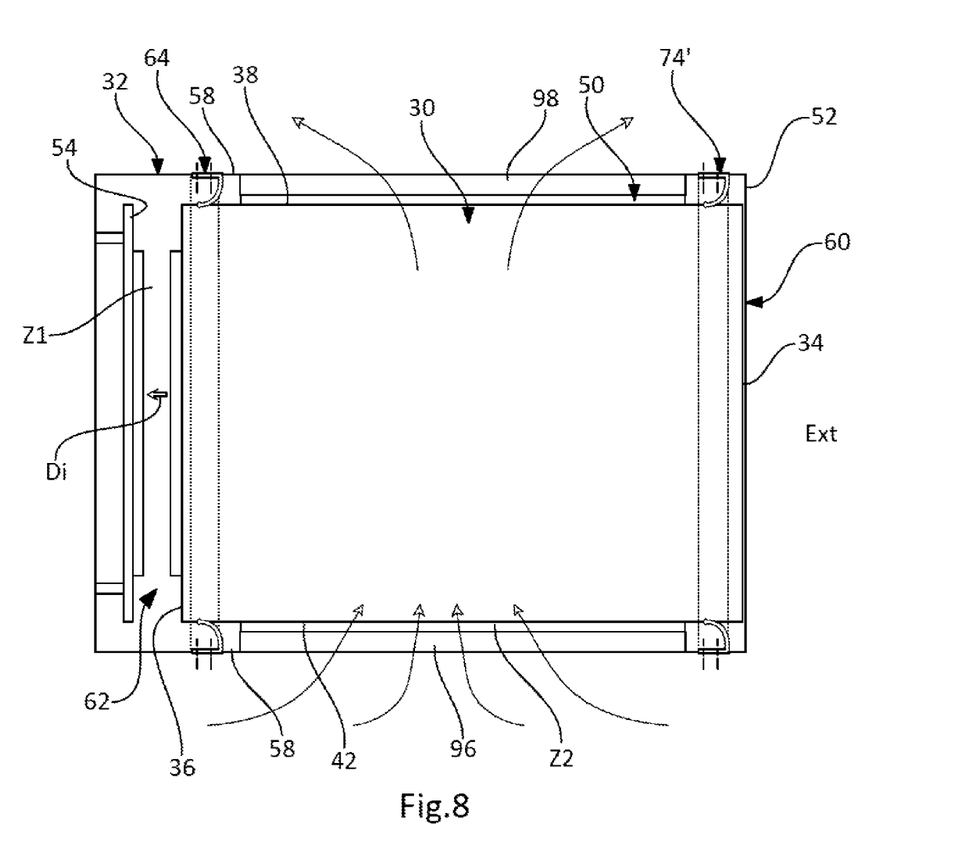

In FIG. 8, the frame 32 comprises two barriers 74' (as shown in FIG. 6B), namely a first barrier 74' in the proximity of the front face of the frame 32 and a second barrier 74' in the proximity of the back of the frame 32, these two barriers being capable of interacting with the peripheral surface of the E & E system 30 when the latter is in the mounted state.

Figure 9:
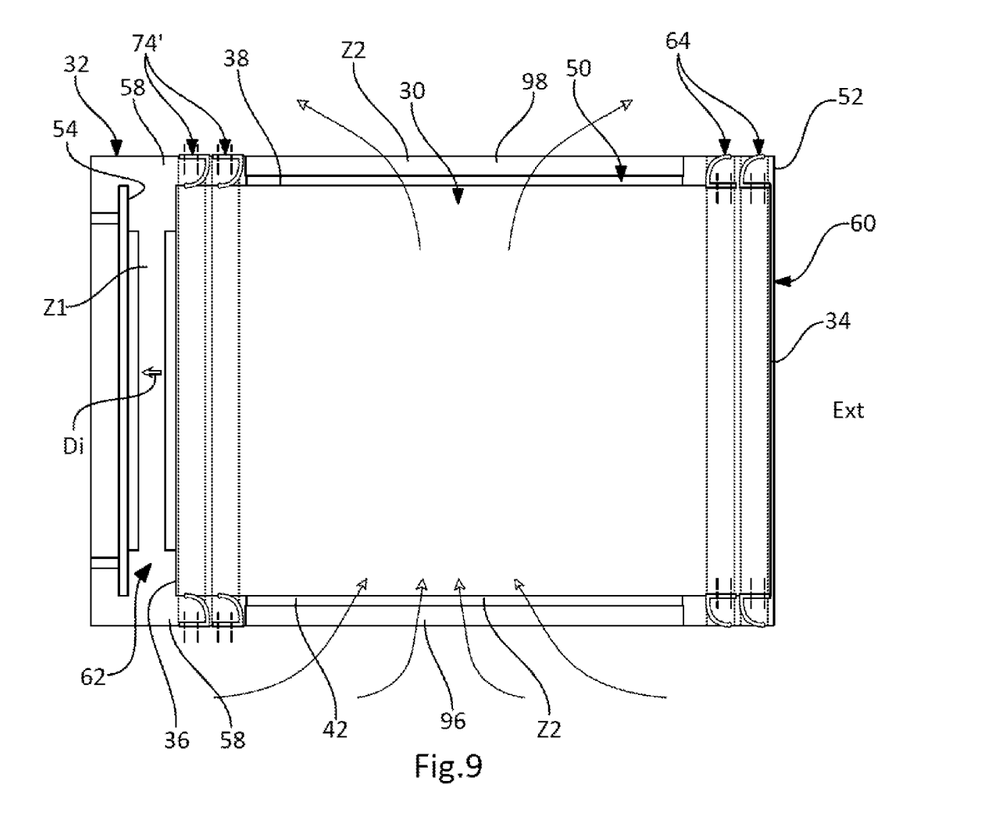

In FIG. 9, the E & E system 30 comprises two adjacent barriers 64 in the proximity of its front face 34, and the frame 32 comprises two adjacent barriers 74' (as shown in FIG. 6B) in the proximity of the back, capable of interacting with the peripheral surface of the E & E system 30 when the latter is in the mounted state. This configuration enables the impermeability to be increased by comparison with the variant shown in FIG. 7.

In FIG. 10, the E & E system 30 comprises a barrier 64 in the proximity of its front face 34, and the frame 32 comprises three barriers, namely a first barrier 74''' located at the front face 52 of the E & E system, in front of the barrier 64, and two other adjacent barriers 74'' and 74''', a first of which conforms to the embodiment shown in FIG. 5A and a second of which conforms to the embodiment shown in FIG. 5B, said barriers 74'' and 74''' being positioned in the proximity of the back of the frame 32 and being capable of interacting with the peripheral surface of the E & E system 30 when the latter is in the mounted state.

In FIG. 11A, the E & E system 30 comprises a barrier 64 in the proximity of its front face 34, and the frame 32 comprises a barrier 74' (as shown in FIG. 6B) in the proximity of the back, capable of interacting with the peripheral surface of the E & E system 30 when the latter is in the mounted state. Additionally, an independent barrier 94 is interposed between the E & E system 30 and the frame 32.

As described above, an electronics cabinet preferably comprises at least two barriers (or at least two groups of barriers) spaced apart, namely at least a first barrier at the rear face 36 of the E & E system 30 or in the proximity of this rear face 36, and at least a second barrier in the proximity of the front face 34 of the E & E system 30.

The first barrier delimits, with the frame and the E & E system, a first area Z1 containing the electrical connection means 46.

The two barriers delimit, with the frame and the E & E system, a second area Z2. Thus the areas Z1 and Z2 are separated by the first barrier and the second barrier, the latter being used to isolate the area Z2 from the outside (Ext).

Advantageously, the area Z2 comprises an air inlet 96 for the cooling air of the E & E system 30 and an outlet 98. The various areas Z2 of an electronics cabinet are connected so as to form a conduit for the cooling air of the E & E systems 30.

This solution increases the impermeability of the area Z1 containing the sensitive elements, in that at least two barriers separate this area Z1 from the outside (Ext).

This solution makes it possible to create an impermeable area Z2 which can be used to channel a flow of cooling air for the E & E system 30.

Preferably, the second barrier conforms to the variants shown in FIGS. 5A and 5B. Thus, even in the absence of an E & E system 30, there is always a barrier delimiting the area Z2, enabling contamination to be reduced during the insertion or withdrawal of an E & E system and permitting the continued use of this area Z2 to channel the cooling air flow.

Preferably, for at least one E & E system, each barrier fixed to the frame is offset towards the rear face relative to the front face of the E & E system when the latter is in the mounted state, in such a way that said front face is always accessible. This arrangement may be repeated for all the E & E systems of the electronics cabinet.

The invention may be applied to areas other than that provided between the frame of the cabinet and an E & E system such as a computer. Thus it may be applied in the same way to the area provided between a frame of a first E & E system such as a computer and a second E & E system such as an electronic circuit card, fitted in the first E & E system. Everything described above can therefore be repeated in an equivalent manner for the purposes of the description of the invention applied to the interior of an E & E system such as a computer.

Figure 12B:
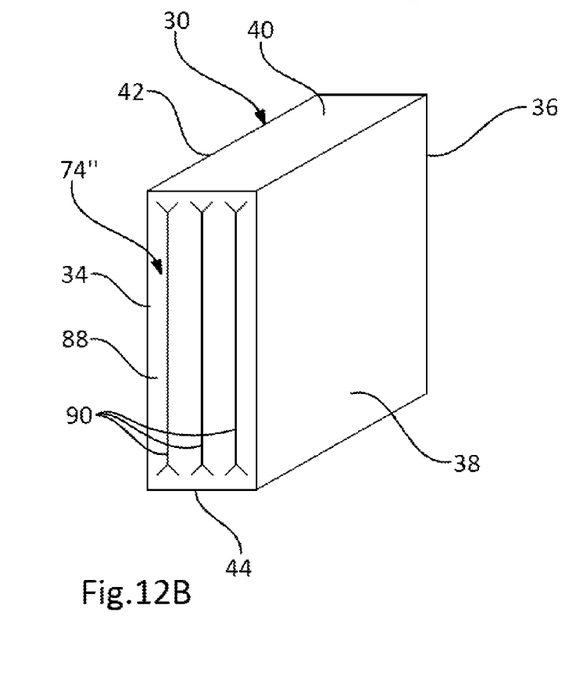
FIG. 12B is a perspective view of the computer of FIG. 12A without a card.
Figure 12C:
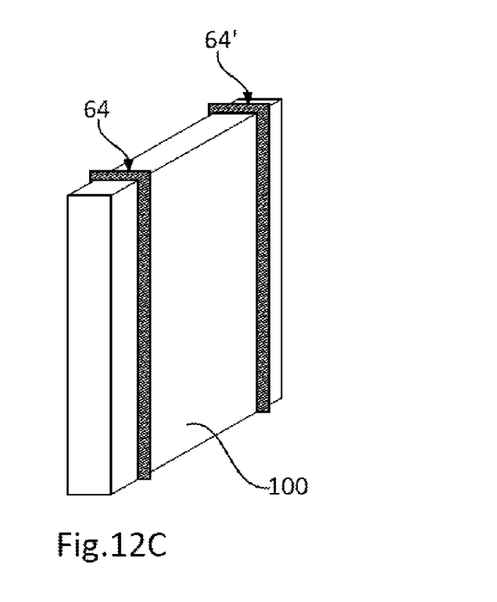
FIG. 12C is a perspective view of a card that can be fitted into the computer of FIG. 12B, illustrating another embodiment of the invention.

Thus, as shown in FIGS. 12A to 12C, at least one barrier 64, 64', 74, 74.1, 74', 74'', 74''' 84 or 94 (only the barriers 64, 64' are shown) may be interposed between the frame 102 of a computer and at least one electronic circuit card 100 fitted into said frame 102 of the computer.

By way of example, as shown in FIG. 12B, a computer comprises a barrier 74'' in the form of a flap 88 which extends over the whole front face 34 and which comprises at least one slit 90 to allow an electronic circuit card 100 to be inserted into the frame 102. In general terms, the frame 102 of the computer comprises at least one barrier 74, 74.1, 74', 74'', 74''', in the same way as the frame 32 of an electronics cabinet.

In one embodiment, shown in FIG. 12C, an electronic circuit card 100 of approximately parallelepipedal shape comprises at least one barrier 64 or 64'.

In an embodiment, a barrier 94 may be interposed between the electronic circuit card 100 and the frame 102 of the computer.

Thus the invention can be applied to any electronics structure comprising at least one frame into which at least one E & E system is fitted.

According to the invention, a first E & E system such as a computer can be fitted into an electronics cabinet, or a second E & E system such as an electronic circuit card can be fitted into another E & E system such as a computer.

Thus, according to an embodiment of the invention, at least one barrier 64, 64', 74, 74.1, 74', 74'', 74''' or 94 can be interposed between a frame 32 of an electronics cabinet and at least one E & E system 30 (such as a computer, for example) fitted into said frame 32, and/or at least one barrier 64, 64', 74, 74.1, 74', 74'', 74''' or 94 can be interposed between the frame 102 of a first E & E system 30 (such as a computer, for example) and at least one second E & E system 100 (such as an electronic circuit card) fitted into the frame 102 of the first E & E system.

When the invention is applied solely to the interior of a first E & E system such as a computer into which at least one second E & E system such as an electronic circuit card is fitted, it enables conventional, non-dust-tight electrical connection means to be used in the interior of the first E & E system. It also makes it possible to dispense with the varnish applied to electronic circuit cards in certain areas.

This solution also has the advantage that it can be applied to existing aircraft, since a prior art E & E system, such as a computer, with no barrier can be replaced with an E & E system equipped with at least one barrier according to the invention, without modification of the cabinet into which it is fitted. Thus if a prior art computer is replaced because it has become obsolete, it can advantageously be replaced with a computer according to an embodiment of the invention in order to benefit from the advantages conferred by the barrier or barriers.

When the invention is applied solely between the frame of the electronics cabinet and an E & E system such as a computer, it enables conventional, non-dust-tight electrical connection means to be used to connect the computer. It may make it possible to use unvarnished cards within the computer and to dispense with the filtering of the air used for cooling the computer.

In another variant of the invention, it is possible to provide barriers according to the invention both between the frame of the cabinet and the computer or computers and between the computer or computers and their respective electronic circuit cards. This solution makes it possible to use conventional electrical connection means which are not dust-tight.

The invention claimed is:

1. An electronics structure comprising:
   at least a frame having a compartment into which at least one E & E system is fitted,
   the compartment comprising a front face, a rear face, an upper wall, a left wall, a right wall, a lower wall, and a first E & E connection means fixed at the rear face,
   the at least one E & E system having a housing comprising a front face, a rear face, a right face, an upper face, a left face, a lower face and a second E & E connection means interposed between the rear face of the at least one E & E system and the rear face of the at least one frame and configured to interact with the first E & E connection means,
   a space being provided between said housing and the compartment, the space formed between the right face and the right wall, the upper face and the upper wall, and the left face and the left wall, and
   at least one barrier impermeable to fine particles, interposed between said housing and the compartment and arranged between the front face and the rear face of the housing such that the front face of the housing is accessible without a need to pass through the at least one barrier when the at least one E & E system is in a mounted state, said at least one barrier delimiting, with the compartment and said housing, a first area isolated from an outside of said electronics structure and containing the first and second E & E connection means, said at least one barrier extending along the right face, the upper face, and the left face, and the lower face of the housing.

2. The electronics structure according to claim 1, wherein the at least one barrier includes a first barrier and a second barrier each impermeable to fine particles, interposed between said housing and the compartment.

3. The electronics structure according to claim 2, wherein the first and second barriers are spaced apart so as to delimit, with the compartment and the housing, a second area isolated from the first area and from the outside of said structure, said second area comprising an inlet for cooling air for the E & E system and a cooling air outlet.

4. The electronics structure according to claim 3, wherein the first barrier is placed at the rear face of the housing or in the proximity of the rear face, and the second barrier is placed in the proximity of the front face of the housing.

5. The electronics structure according to claim 1, wherein the at least one barrier is fixed to the housing.

6. The electronics structure according to claim 1, wherein the at least one barrier is fixed to the compartment.

7. An aircraft comprising:
   an electronics structure, the electronics structure comprising:
   at least a frame having a compartment into which at least one E & E system is fitted, the compartment comprising a front face, a rear face, an upper wall, a left wall, a right wall, and a lower wall, the at least one E & E system having a housing comprising a front face, a rear face, a right face, an upper face, a left face, and a lower face,
   a connection means interposed between the rear face of the housing and the rear face of the compartment,
   a space being provided between said housing and the compartment, the space formed between the right face and the right wall, the upper face and the upper wall, and the left face and the left wall, and
   at least one barrier impermeable to fine particles, at the front face of the compartment such that the front face of the housing is accessible without a need to pass through the at least one barrier when the at least one E & E system is in a mounted state, said at least one barrier delimiting, with the compartment and said housing, a first area isolated from an outside of said electronics structure, said at least one barrier extending in a plane transverse to at least one of the right face, the upper face, the left face, or the lower face of the housing and configured to contact at least the right face, the upper face, and the left face of the housing when the at least one E & E system is in the mounted state.

8. The electronics structure according to claim 7, wherein the at least one barrier comprises a wall configured to extend over a whole cross section of the compartment when the at least one E & E system is not mounted in the compartment and through which the at least one E & E system can pass.

9. The electronics structure according to claim 8, wherein the wall comprises a flap with at least one slit allowing an insertion of the at least one E & E system.

10. The electronics structure according to claim 8, wherein the wall comprises at least first and second brushes positioned facing each other, each brush comprising thread-like members whose free ends overlap.

11. The electronics structure according to claim 7, wherein the at least one barrier comprises a flap configured to extend over the whole front face of the compartment when the at least one E & E system is not mounted in the compartment and comprising at least one slit to allow the at least one E & E system to be inserted into the compartment.

12. The electronics structure according to claim 7, wherein the at least one barrier comprises a plurality of brushes whose thread-like members are arranged in planes substantially coinciding with the front face of the compartment.

* * * * *